(12) United States Patent
Lee et al.

(10) Patent No.: US 6,957,380 B2
(45) Date of Patent: Oct. 18, 2005

(54) METHOD FOR NETWORK ADAPTIVE ERROR CONTROL FOLP

(75) Inventors: Eung-don Lee, Daejon (KR); Tae-gyu Kang, Daejon (KR)

(73) Assignees: Electronics and Telecommunications Research Institue (KR); Korea Telecom (KR)

(*) Notice: Subject to any disclaimer, the term of this patent is extended or adjusted under 35 U.S.C. 154(b) by 411 days.

(21) Appl. No.: 10/236,400

(22) Filed: Sep. 5, 2002

(65) Prior Publication Data

US 2003/0126540 A1 Jul. 3, 2003

(30) Foreign Application Priority Data

Dec. 27, 2001 (KR) ........................................ 2001-86342

(51) Int. Cl.[7] ............................................ H03M 13/35
(52) U.S. Cl. ..................................................... 714/774
(58) Field of Search ......................................... 714/774

(56) References Cited

U.S. PATENT DOCUMENTS

| | | | | |
|---|---|---|---|---|
| 6,438,105 B1 | * | 8/2002 | Qarni et al. | 370/231 |
| 6,483,600 B1 | * | 11/2002 | Schuster et al. | 358/1.15 |
| 6,563,599 B1 | * | 5/2003 | Whitfield | 358/1.15 |
| 6,603,569 B1 | * | 8/2003 | Conklin et al. | 358/1.15 |
| 6,711,166 B1 | * | 3/2004 | Amir et al. | 370/395.1 |
| 6,728,308 B1 | * | 4/2004 | Chu et al. | 375/222 |

FOREIGN PATENT DOCUMENTS

| | | |
|---|---|---|
| KR | 1999-0051938 | 7/1999 |
| KR | 1999-0086290 | 12/1999 |

OTHER PUBLICATIONS

An adaptive protocol for real–time fax communications over the Internet by C.K. Yeo et al. Computer Communications 24 (2001) 1134–1146.

* cited by examiner

*Primary Examiner*—Stephen M. Baker
(74) *Attorney, Agent, or Firm*—Blakely Sokoloff Taylor & Zafman

(57) ABSTRACT

Provided is a method for a network adaptive error control for selecting an appropriate error control method according to the statue of a network, in transmitting a fax data over the Internet by using a T.38 protocol. The provided method includes receiving a T.38 fax data to recognize errors, transmitting a predetermined statistical information on the T.38 fax data to the media gateway controllers, selecting an error control method by determining the status of a network over which the T.38 fax data is transmitted, based on the statistical information, transmitting the error control method to the gateway that transmits the T.38 fax data, and renewing an existing error control method by receiving the error control method and transmitting the T.38 fax data according to the renewed error control method. According to the provided method, an appropriate error control method can be used according to the status of a network in real time, in transmitting a fax data over the Internet. Therefore, the performance of an error control improves, thereby securing a stable communication and improving a transmission speed. As a result, a communication speed increases so that transmission efficiency improves.

14 Claims, 3 Drawing Sheets

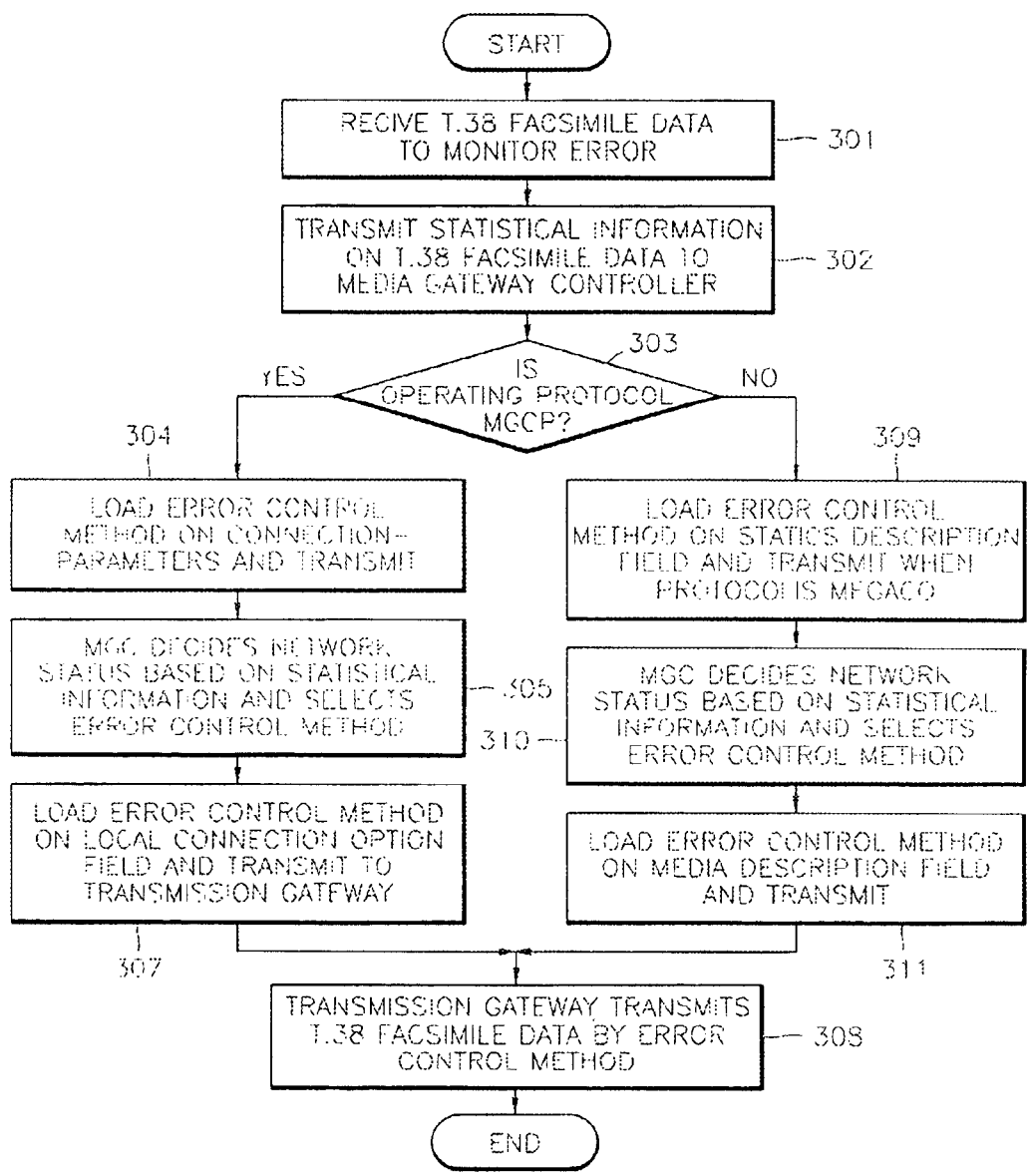

METHOD FOR NETWORK ADAPTIVE ERROR CONTROL FOLP

BACKGROUND OF THE INVENTION

1. Field of the Invention

The present invention relates to a method for an error control in a fax over Internet protocol (FoIP) using media gateway control protocol/media gateway control (MGCP/MEGACO), and more particularly, to a method for selecting an appropriate error control method according to the statue of a network by using an MGCP or an MEGACO.

2. Description of the Related Art

Korean Laid-open Patent No. 1999-0051938 discloses an apparatus and a method for restoring an image to restore an image of a fax data distorted in transmitting the fax data. In this case, when an error occurs in a received fax data, the apparatus decides a modulation method for transmitting and receiving the fax data so as to read out a plurality of error patterns according to the decided modulation method and to monitor errors in the received fax data, line-by-line. Thereafter, if an error occurred in a line, the apparatus corrects the error by using the error pattern to provide a high quality image to a user.

Korean Laid-open Patent No. 1999-0086290 discloses an apparatus and a method for checking a transmission status of a fax data. In this case, when a sender, which has transmitted a fax data, requires a voice demand function, a recipient automatically services a reception status of the fax data. Thus, the sender conveniently recognizes the transmission status of the fax data. In addition, the recipient services other messages to improve reliability of the transmission of the fax data.

However, conventional apparatuses and methods concern with the transmission of a fax data only over a telephone network using a conventional T.30 protocol. Therefore, the conventional apparatuses and methods cannot be applied to the transmission of a fax data using a T.30 protocol. Furthermore, in the conventional methods, a method for an error control in the transmission of a fax data is fixed; therefore, reliability of the transmission of a fax data is lowered when the status of a telephone network is deteriorated.

SUMMARY OF THE INVENTION

To solve the above-described problems, it is an objective of the present invention to provide a method for a network adaptive error control according to the status of a network, in a fax over Internet protocol (FoIP) by using a T.38 protocol.

To accomplish the above objective of the present invention, a method for a network adaptive error control according to the present invention includes receiving a T.38 fax data, monitoring the T.38 fax data to recognize errors, and transmitting a predetermined statistical information on the T.38 fax data to the media gateway controllers.

The method for a network adaptive error control will be described by using the steps performed in a transmission gateway, a reception gateway, and a media gateway.

To accomplish the above objective of the present invention, a method for a network adaptive error control according to the present invention includes receiving a predetermined statistical information on a T.38 fax data from a gateway that receives the T.38 fax data, selecting an error control method by determining the status of a network over which the T.38 fax data is transmitted, based on the statistical information, and transmitting the error control method to the gateway that transmits the T.38 fax data.

The method for a network adaptive error control will be described by using the steps performed in a transmission gateway, a reception gateway, and a media gateway.

To accomplish the above objective of the present invention, a method for a network adaptive error control according to the present invention includes receiving packets from the media gateway controllers, obtaining an error control method from the packets, and renewing an existing error control method to the received error control method and transmitting a T.38 fax data.

The method for a network adaptive error control will be described by using the steps performed in a transmission gateway, a reception gateway, and a media gateway.

To accomplish the above objective of the present invention, a method for a network adaptive error control according to the present invention includes receiving a T.38 fax data to monitor errors in the data, transmitting a predetermined statistical information on the data to a media gateway controller, deciding the status of a network based on the statistical information to select an error control method, transmitting the error control method to a gateway which transmits the T.38 fax data, and renewing an existing error control method by receiving the error control method and transmitting the T.38 fax data according to the renewed error control method.

BRIEF DESCRIPTION OF THE DRAWINGS

The above objective and advantages of the present invention will become more apparent by describing in detail a preferred embodiment thereof with reference to the attached drawings in which:

FIG. 3 is a flowchart illustrating a method for a network adaptive error control according to the present invention.

DETAILED DESCRIPTION OF THE INVENTION

Figure 1:
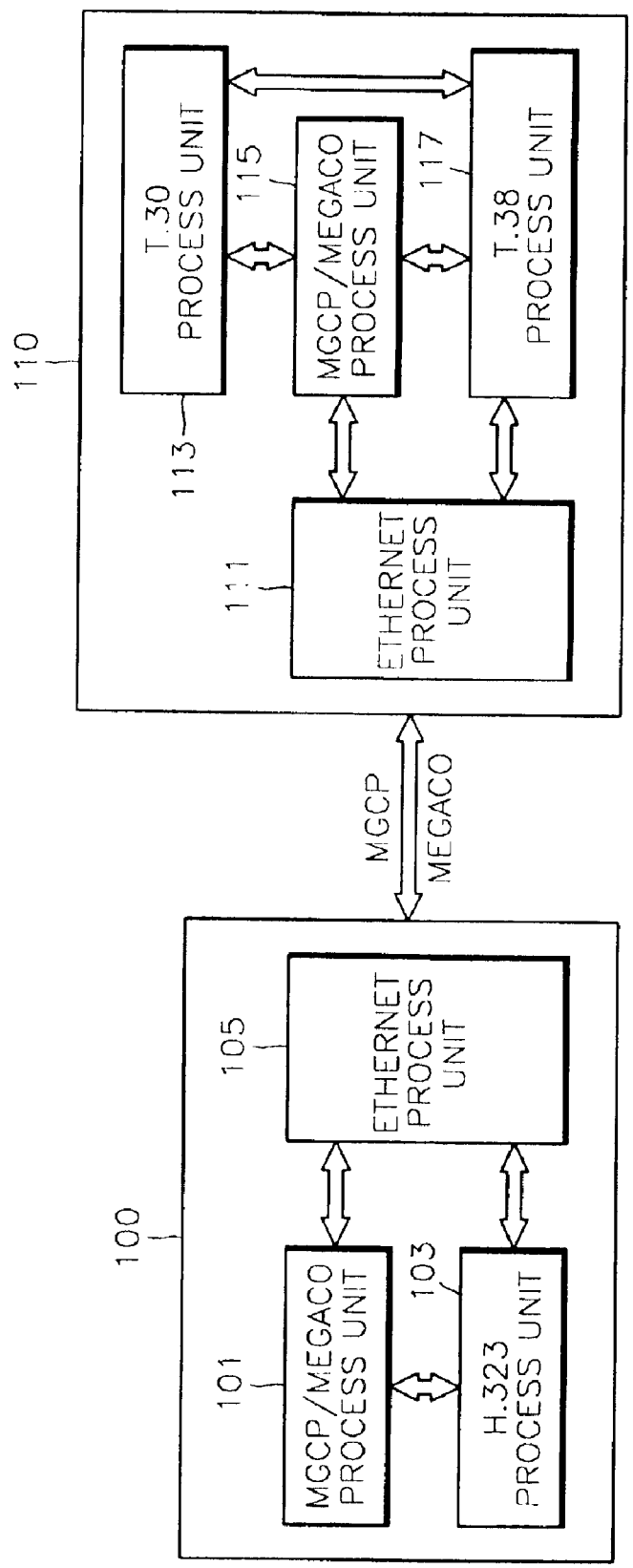
FIG. 1 is a diagram illustrating the constitution of a network to which a method for an error control according to the present invention is applied.
Figure 2:
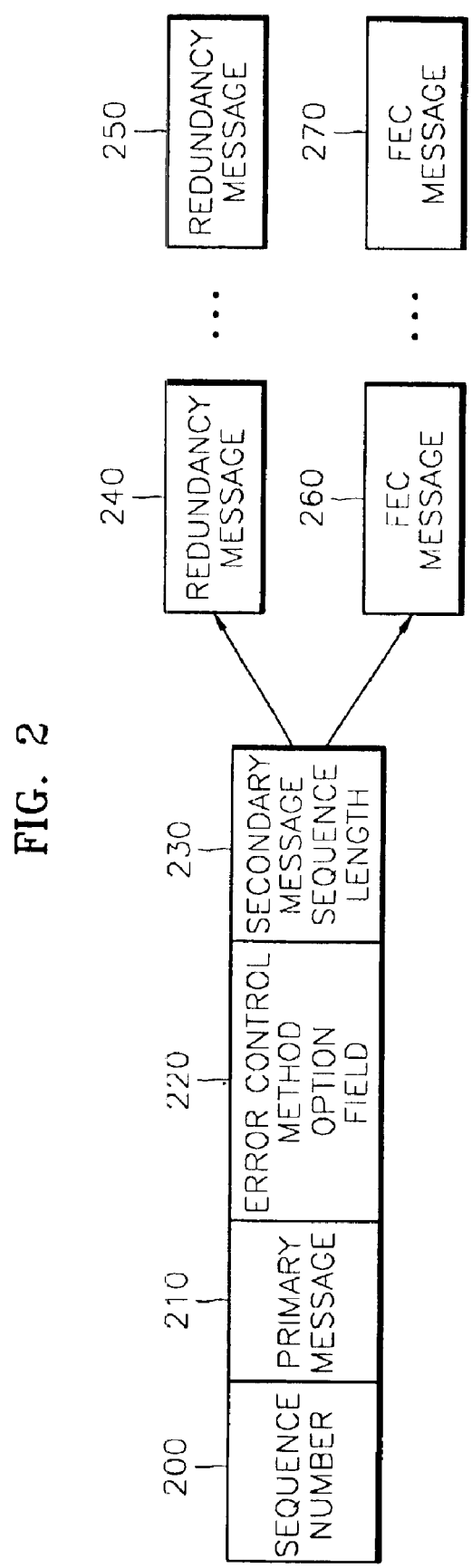
FIG. 2 is a diagram illustrating the constitution of a T.38 packet.

FIG. 1 is a diagram illustrating the constitution of a network to which a method for an error control according to the present invention is applied, and FIG. 2 is a diagram illustrating the constitution of a T.38 packet. FIG. 3 is a flowchart illustrating a method for a network adaptive error control according to the present invention.

A system to which a method for a network adaptive error control according to the present invention is applied will now be described with reference to FIG. 1. The system is constituted by a media gateway controller 100 and a gateway 110 which can be controlled by the media gateway controller 100, to perform a fax over Internet protocol (FoIP). Generally, communications between the media gateway controller 100 and the gateway 110 are performed by using a media gateway control protocol (MGCP) or a media gateway control (MEGACO). Here, the media gateway controller 100 is formed of an MGCP/MEGACO process unit 101, an H.323 process unit 103, and an Ethernet process unit 105. The gateway 110 is formed of an Ethernet process unit 111, a T.30 process unit 113, an MGCP/MEGACO process unit 115, and a T.38 process unit 117.

Each component of the media gateway controller 100 and the gateway 110 will now be described in detail.

The MGCP/MEGACO process units 101 and 115 process MGCP or MEGACO, which is a communication protocol between the media gateway controller 100 and the gateway 110.

The Ethernet process units 105 and 111 convert an upper data of the MGCP or the MEGACO into an Internet data to transmit the data over the Internet.

The H.323 process unit 103 sends, receives, and processes an H.323 call setup data, which is transmitted into the media gateway controller 100. An H.323 protocol is a multimedia communication system standard which supports audio and video data in a packet-based network including the Internet, where the standardization is formulated by the International Telecommunication Union-Telecommunication Standardization Sector (ITU-T). The H.323 process unit 103 processes H.225.0 (call signaling protocols and media stream packetization for packet-based multimedia communication systems) registration, admission, and status (RAS), H.225.0 Q931, and H.245 messages.

The T.30 process unit 113, operating as a conventional fax machine for an existing public telephone network, processes a T.30 data that is used in transmitting/receiving a fax data to/from a device on a public switched telephone network (PSTN).

The T.38 process unit 117 as a functional block for processing a T.38 protocol, which transmits and receives a fax data over the Internet, converts the T.30 data transmitted over the public telephone network into the T.38 data and transmits the T.38 data over the Internet via the Ethernet process unit 111. In addition, the T.38 process unit 117 converts the T.38 data received from the Ethernet process unit 111 over the Internet into the T.30 data and transmits the T.30 data over the public telephone network via the T.30 process unit 113.

FIG. 2 is a diagram illustrating the constitution of a T.38 packet. As shown in FIG. 2, a T.38 packet is formed of a sequence number 200, a primary message 210, an error control method option field 220, a secondary message sequence length 230, and secondary message sequences 240, 250, 260, and 270. Since the elements of the T.38 packet are well known to those skilled in the art, descriptions about the elements of the T.38 packet will be omitted.

Error control methods include a redundancy method and a forward error correction (FEC) method. Here, the error control method is determined by the value of the error control method option field 220 of the T.38 packet of FIG. 2. Therefore, the secondary message sequences are filled with redundancy messages 240 and 250 or FEC messages 260 and 270.

The secondary message sequence length 230, establishing the length of the secondary message sequences, denotes the length of the redundancy messages 240 and 250 or the FEC messages 260 and 270. When the secondary message sequence length 230 increases, an error control performance improves. In particular, in the case where the FEC error control method is used, a burst error can be corrected by increasing the secondary message sequence length 230.

However, in a conventional error control method, an error control method option field 220 and a secondary message sequence length 230 are determined by a manager in an early stage and not changed regardless of changes in the status of a network through which a T.38 fax data is transmitted, thereby causing inefficiency. In other words, when the status of the network is good, a secondary message sequence length becomes so excessively large that a transmission speed is deteriorated. When the status of the network is bad, the secondary message sequence length becomes so relatively small that errors are likely to occur.

A method for improving a conventional error control method will now be described with reference to FIG. 3, a flowchart illustrating a method for a network adaptive error control according to the present invention.

Here, a method for a network adaptive error control according to the present invention will be described based on a network having two gateways and media gateway controllers that transmit and receive a T.38 data. Therefore, the gateway 110 of FIG. 1 can operate as a transmission gateway and a reception gateway. A reception gateway receives a T.38 data while monitoring errors in a data packet in step 301. Then, the result of the monitoring operation, such as statistical information including a number of transmission/reception packets, a jitter, and a number of defective packets, is transmitted to a media gateway controller 100 of FIG. 1 in step 302. Here, a field on which the statistical information is loaded is determined according to the type of an operating protocol, which is an MGCP or an MEGACO in step 303. When the operating protocol is the MGCP, the statistical information is loaded on a connection-parameters field of a notify command to report to the media gateway controller 100 in step 304. Meanwhile, according to an MGCP document (RFC2705), the connection-parameters field is defined in a command other than the notify command; therefore, the connection-parameters field is added to the notify command in the error control method according to the present invention. The media gateway controller 100 analyzes the received statistical information to recognize the status of a network over which a T.38 data is transmitted and select an appropriate error control method in step 305. Here, the media gateway controller 100 has to transmit the selected error control method to a gateway that transmits the T.38 data. Since the operating protocol is the MGCP, the error control method is loaded on a local connection option field of a modify connection command in step 307. Thereafter, a transmission gateway receives the error control method to convert an existing error control method and continuously receive the T.38 data in step 308.

When the operating protocol is the MEGACO, the statistical information is loaded on a statistics description field of a notify command to report to the media gateway controller 100 in step 309. Meanwhile, according to an MEGACO document (RFC3015), the statistics description field is defined in a command other than the notify command; therefore, the statistics description field is added to the notify command in the error control method according to the present invention. The media gateway controller 100 analyzes the received statistical information to recognize the status of a network over which a T.38 data is transmitted and select an appropriate error control method in step 310. Here, the media gateway controller 100 has to transmit the selected error control method to a gateway that transmits the T.38 data. Since the operating protocol is the MEGACO, the error control method is loaded on a media description field of a modify command in step 311. Thereafter, the transmission gateway receives the error control method to convert an existing error control method and continuously receive the T.38 data in step 308.

It is noted that the present invention is not limited to the preferred embodiment described above, and it is apparent that variations and modifications by those skilled in the art can be effected within the spirit and scope of the present invention defined in the appended claims.

A method for a network adaptive error control in an FoIP according to the present invention can be realized as a code on a recording medium which can be read out by a computer. Here, the recording medium includes any kind of recording devices in which data are recorded, such as ROM, RAM, CD-ROM, a magnetic tape, a floppy disk, and an optical data recording device, while further including a carrier wave, i.e., transmission over the Internet. In addition, the recording media read out by a computer are distributed to computer systems, connected by a network, to record and execute codes, which can be read out by a computer, in a distribution manner.

As described above, when an appropriate FoIP error control method is selected by using a method for a network adaptive error control according to the present invention, an appropriate error control method can be used according to the status of a network in real time, in transmitting a fax data over the Internet. Therefore, the performance of an error control improves, thereby securing a stable communication and improving a transmission speed. As a result, a communication speed increases so that transmission efficiency improves.

What is claimed is:

1. A method for a network adaptive error control, wherein errors are controlled in a network formed of a plurality of gateways and media gateway controllers for a fax on Internet protocol (FoIP), comprising:
   (a) receiving T.38 fax data;
   (b) monitoring the T.38 fax data to recognize errors; and
   (c) transmitting predetermined statistical information on the T.38 fax data to the media gateway controllers.

2. The method for a network adaptive error control of claim 1, wherein a transmission method varies according to a protocol in the act of (c).

3. The method for a network adaptive error control of claim 2, wherein the statistical information is loaded in a connection parameter field to be transmitted when the protocol is a media gateway control protocol (MGCP).

4. The method for a network adaptive error control of claim 2, wherein the statistical information is loaded in a statistics description parameter field to be transmitted when the protocol is a media gateway control (MEGACO).

5. A method for a network adaptive error control, wherein errors are controlled in a network formed of a plurality of gateways and media gateway controllers for an FoIP, comprising:
   (a) receiving predetermined statistical information on a T.38 fax data transmission from a gateway that receives the T.38 fax data;
   (b) selecting an error control method by determining the status of a network over which the T.38 fax data is transmitted, based on the statistical information; and
   (c) transmitting the error control method to the gateway that transmits the T.38 fax data.

6. The method for a network adaptive error control of claim 5, wherein a transmission method varies according to a protocol, in the act of (c).

7. The method for a network adaptive error control of claim 6, wherein the error control method is loaded on a local connection option field to be transmitted when the protocol is an MGCP.

8. The method for a network adaptive error control of claim 6, wherein the error control method is loaded on a media description field to be transmitted when the protocol is an MEGACO.

9. A method for a network adaptive error control, wherein errors are controlled in a network formed of a plurality of gateways and media gateway controllers for an FoIP, comprising:
   (a) receiving packets from the media gateway controllers;
   (b) obtaining an error control method from the packets; and
   (c) renewing an existing error control method to the received error control method and transmitting T.38 fax data.

10. A method for a network adaptive error control, wherein errors are controlled in a network formed of a plurality of gateways and media gateway controllers for an FoIP, comprising:
    (a) receiving T.38 fax data to monitor errors in the data;
    (b) transmitting predetermined statistical information on the data to a media gateway controller;
    (c) deciding the status of a network based on the statistical information to select an error control method;
    d) transmitting the error control method to a gateway which transmits the T.38 fax data; and
    (e) renewing an existing error control method by receiving the error control method and transmitting the T.38 fax data according to the renewed error control method.

11. The method for a network adaptive error control of claim 10, wherein the statistical information is loaded in a connection parameter field to be transmitted when the protocol is an MGCP, in the act of (b).

12. The method for a network adaptive error control of claim 10, wherein the statistical information is loaded in a statistics description parameter field to be transmitted when the protocol is an MEGACO, in the act of (b).

13. The method for a network adaptive error control of claim 10, wherein the error control method is loaded in a local connection option field to be transmitted when the protocol is an MGCP, in the act of (d).

14. The method for a network adaptive error control of claim 10, wherein the error control method is loaded in a media description field to be transmitted when the protocol is an MEGACO, in the act of (d).

* * * * *